United States Patent
Huang et al.

(10) Patent No.: US 9,755,112 B2
(45) Date of Patent: Sep. 5, 2017

(54) LED DIE WITH BARRIER LAYER

(71) Applicant: ADVANCED OPTOELECTRONIC TECHNOLOGY, INC., Hsinchu Hsien (TW)

(72) Inventors: Chien-Shiang Huang, Hsinchu (TW); Tzu-Chien Hung, Hsinchu (TW)

(73) Assignee: ADVANCED OPTOELECTRONICS TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/879,111

(22) Filed: Oct. 9, 2015

(65) Prior Publication Data
US 2016/0211416 A1    Jul. 21, 2016

(30) Foreign Application Priority Data
Jan. 21, 2015   (CN) .......................... 2015 1 0029268

(51) Int. Cl.
*H01L 33/40*   (2010.01)
*H01L 33/38*   (2010.01)

(52) U.S. Cl.
CPC ............ *H01L 33/40* (2013.01); *H01L 33/405* (2013.01); *H01L 33/38* (2013.01)

(58) Field of Classification Search
CPC ......... H01L 33/36; H01L 33/38; H01L 33/40; H01L 33/405; H01L 33/62
See application file for complete search history.

(56) References Cited

U.S. PATENT DOCUMENTS

| | | | | |
|---|---|---|---|---|
| 2012/0199861 A1* | 8/2012 | Tsuji | ..................... | H01L 33/405 257/98 |
| 2012/0267673 A1* | 10/2012 | Okabe | ..................... | H01L 33/40 257/99 |
| 2013/0049053 A1* | 2/2013 | Kususe | ................. | H01L 33/405 257/98 |
| 2014/0124730 A1* | 5/2014 | Choi | ....................... | H01L 33/10 257/13 |
| 2015/0171298 A1* | 6/2015 | Cho | ......................... | H01L 33/38 257/98 |
| 2015/0207051 A1* | 7/2015 | Yoon | ...................... | H01L 33/14 362/382 |

(Continued)

FOREIGN PATENT DOCUMENTS

EP    2533291 A    12/2012
TW    200537711    11/2005
(Continued)

*Primary Examiner* — Daniel Luke
(74) *Attorney, Agent, or Firm* — Steven Reiss

(57) ABSTRACT

An LED die includes a base, and an N-typed semiconductor layer, an active layer and a P-typed semiconductor layer formed on the base that order. The LED die also includes an N-electrode and a P-electrode. The N-electrode is arranged on the N-typed semiconductor layer and electrically connected therewith. The P-electrode is arranged on the P-typed semiconductor layer and electrically connected therewith. The LED die further includes a barrier layer arranged between the P-typed semiconductor layer and the P-electrode. The barrier layer includes at least two materials of Cr, Ni and Ti. The at least two materials of Cr, Ni and Ti are stacked together to form the barrier layer.

2 Claims, 1 Drawing Sheet

(56) References Cited

U.S. PATENT DOCUMENTS

| | | | |
|---|---|---|---|
| 2015/0372208 A1* | 12/2015 | Chae | H01L 33/62 257/98 |
| 2016/0005941 A1* | 1/2016 | Tsai | H01L 33/382 257/98 |
| 2016/0035935 A1* | 2/2016 | Han | H01L 21/02458 257/13 |

FOREIGN PATENT DOCUMENTS

| | | |
|---|---|---|
| TW | 201322484 A | 6/2013 |
| TW | 201336107 A | 9/2013 |

* cited by examiner

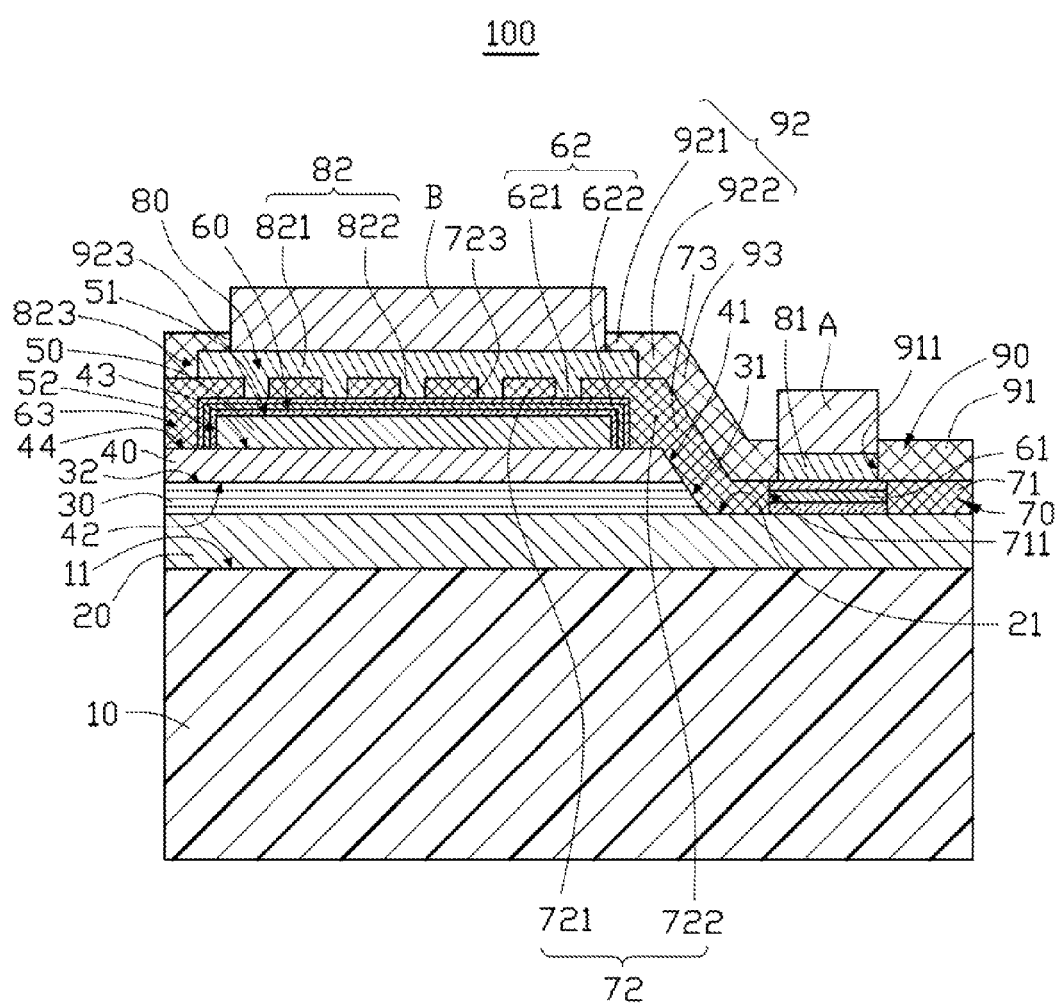

LED DIE WITH BARRIER LAYER

FIELD

The subject matter relates to a semiconductor element, and particularly relates to a light emitting diode (LED) die.

BACKGROUND

In a process of a traditional LED die works, current from a p-electrode to an n-electrode is easily collected on the shortest path between the p-electrode and the n-electrode. The current collection will cause current crowding effect. A barrier layer is configured on the path between the p-electrode and the n-electrode to uniform distribution of the current. The common barrier layer is made of Rh, Pt, Ru, Zr, W or other metals. However, Rh, Pt, Ru and Zr are noble metals which easily result in higher production costs of the LED die. And when the barrier layer is made of W, a special machining process is needed, therefore resulting in LED die manufacturing process complicated.

BRIEF DESCRIPTION OF THE DRAWINGS

Implementations of the present technology will now be described, by way of example only, with reference to the attached FIGURES:

The FIGURE is a cross-section view of an LED die in accordance with an exemplary embodiment of the present disclosure.

DETAILED DESCRIPTION

It will be appreciated that for simplicity and clarity of illustration, where appropriate, reference numerals have been repeated among the different FIGURES to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures and components have not been described in detail so as not to obscure the related relevant feature being described. Also, the description is not to be considered as limiting the scope of the exemplary embodiments described herein. The drawings are not necessarily to scale and the proportions of certain parts have been exaggerated to better illustrate details and features of the present disclosure.

Referring to the FIGURE, an LED die 100 of the present disclosure includes a base 10, an N-typed semiconductor layer 20, an active layer 30, a P-typed semiconductor layer 40, a reflecting layer 50, a barrier layer 60, a first insulating layer 70, an electronic connecting layer 80, a second insulating layer 90, an N-electrode A and a P-electrode B formed on the base 10 that order. The N-electrode A and the P-electrode B are electronically connected to the N-typed semiconductor layer 20 and the P-typed semiconductor layer 40 respectively.

The base 10 is a regular plate. The base 10 can be made of sapphire, SiC, Si or GaN. In this exemplary embodiment, the base 10 is made of sapphire to control production cost of the LED die 100.

The N-typed semiconductor layer 20 covers a top surface 11 of the base 10 completely. In other words, an area of a bottom surface of the N-typed semiconductor layer 20 is equal to an area of the top surface 11 of base 10. In this exemplary embodiment, the N-typed semiconductor layer 20 is an N-typed GaN layer.

The active layer 30 is formed on one end of the N-typed semiconductor layer 20. A largest area of a bottom surface of the active layer 30 is smaller than an area of a top surface of the N-typed semiconductor layer 20, thereby exposing part of the top surface of the N-typed semiconductor layer 20. The exposed top surface of the N-typed semiconductor layer 20 is marked as 21. A horizontal area of the active layer 30 decreases gradually in a direction away from the base 10. In other words, a side surface 31 of the active layer 30 near the exposed top surface 21 of the N-typed semiconductor layer 20 is slantwise to the top surface 11 of the base 10. In this exemplary embodiment, the active layer 30 is a MOWs layer.

The P-typed semiconductor layer 40 is stacked on the active layer 30. An area of a bottom surface 42 of the P-typed semiconductor layer 40 is equal to an area of a top surface 32 of the active layer 30. A horizontal area of the P-typed semiconductor layer 40 decreases gradually in a direction away from the N-typed semiconductor layer 20. In other words, a side surface 41 of the P-typed semiconductor layer 40 near the exposed top surface 21 of the N-typed semiconductor layer 20 is slantwise. A slope of the side surface 41 of the P-typed semiconductor layer 40 is equal to a slope of the side surface 31 of the active layer 30. The side surface 41 of the P-typed semiconductor layer 40 connects to the side surface 31 of the active layer 30, together forming a straight line. In this exemplary embodiment, the P-typed semiconductor layer 40 is a P-typed GaN layer.

The reflecting layer 50 is formed on center of a top surface 43 of the P-typed semiconductor layer 40. An area of a bottom surface of the reflecting layer 50 is smaller than an area of the top surface 43 of the P-typed semiconductor layer 40. The reflecting layer 50 can be made of Al, Ag, Au, Cu, Ni, Ru, Rh, Mo, Zr, Pt or any of its alloys. The reflecting layer 50 can enhance the luminous efficiency of the LED die 100.

The barrier layer 60 includes a first barrier part 61 and a second barrier part 62. The first barrier part 61 and the second barrier part 62 are spaced apart from each other. The first barrier part 61 is formed on the N-typed semiconductor layer 20. The second barrier part 62 is formed on the P-typed semiconductor layer 40. The barrier layer 60 includes at least two materials of Cr, Ni and Ti. In this exemplary embodiment, the barrier layer 60 is made of Cr, Ni and Ti. The three materials are stacked. Preferably, the three materials are staggered and stacked. A thickness of the barrier layer 60 is less than 10 μm.

Specifically, the first barrier part 61 is formed on the exposed top surface 21 of the N-typed semiconductor layer 20. The first barrier part 61 is regularly flat-shaped. The first barrier part 61 is used for bearing the N-electrode A. The N-electrode A is electronically connected to then-typed semiconductor layer 20.

The second barrier part 62 is formed around the reflecting layer 50. The second barrier part 62 is n-shaped. The second barrier part 62 covers a top surface 51 and a side surface 52 of the reflecting layer 50. The second barrier part 62 includes a main body 621 and a side wall 622. The side wall 622 extends downwards from peripheral of the main body 621 vertically. The main body 621 is attached on the top surface 51 of the reflecting layer 50. A horizontal area of the main body 621 is smaller than an area of the top surface 43 of the P-typed semiconductor layer 40, thereby exposing edges of the top surface 43 of the P-typed semiconductor layer 40.

The side wall 622 is coupled with an exposed edge 44 of the top surface 43 of the P-typed semiconductor layer 40 to formed a first sidestep part 63. The side wall 622 is a ring shaped. The bottom of the side wall 622 is attached on the top surface 43 of the P-typed semiconductor layer 40 and surrounds the side surface 52 of the reflecting layer 50.

The first insulating layer 70 covers a top surface of the barrier layer 60 and further extends to cover the exposed top surface 21 of the N-typed semiconductor layer 20.

Specifically, the first insulating layer 70 includes a first insulating part 71, a second insulating part 72 and a connecting part 73. The first insulating part 71 is formed on the exposed top surface 21 of the N-typed semiconductor layer 20. The second insulating part 72 is formed on the P-typed semiconductor layer 40. The connecting part 73 connects the first insulating part 71 and second insulating part 72.

The first insulating part 71 covers the exposed top surface 21 of the N-typed semiconductor layer 20 except the area where the first barrier part 61 located. A through hole 711 is defined on the first insulating part 71 to hold the first barrier part 61. In other words, the first insulating part 71 is a circular ring shaped and surrounds the first barrier part 61. A top surface of the first insulating part 71 and a top surface of the first barrier part 61 are coplanar.

The second insulating part 72 includes a main part 721 and a limiting part 722 connected with the main part 721. The main part 721 is formed on the top surface of the main body 621 of the second barrier part 62. The limiting part 722 extends downwards from peripheral of the main part 721 vertically. A plurality of through holes 723 are defined on the main part 721, thereby exposing part of the second barrier part 62. In this exemplary embodiment, the through holes 723 are spaced apart from each other regularly to ensure uniform distribution of current. The limiting part 722 is formed to fill the first sidestep part 63 and surrounds peripheral of the side wall 622. A top surface of the main part 721 of the second insulating part 72 is parallel to a top surface of the first insulating part 71.

The connecting part 73 is formed on the side surface 31 of the active layer 30 and the side surface 41 of the P-typed semiconductor layer 40. An obtuse angle is defined by the connecting part 73 and the first insulating part 71. In this exemplary embodiment, the first insulating part 71, the second insulating part 72 and the connecting part 73 are obtained by integrated molding.

The electronic connecting layer 80 includes a first electronic connecting part 81 and a second electronic connecting part 82. The first electronic connecting part 81 is formed on the N-typed semiconductor layer 20. The second electronic connecting part 82 is formed on the P-typed semiconductor layer 40. The first electronic connecting part 81 and the second electronic connecting part 82 are spaced apart from each other. The electronic connecting layer 80 can be made of Al, Ag, Au, Cu, Ni, Ru, Rh, Mo, Zr, Pt or any of its alloys.

Specifically, the first electronic connecting part 81 is formed on the top surface of the first barrier part 61. A width of the first electronic connecting part 81 is smaller than a diameter of the first barrier part 61. In this exemplary embodiment, the first electronic connecting part 81 is a regular rectangle.

The second electronic connecting part 82 includes an electronic connecting board 821 and a plurality of electronic connecting masts 822. Each electronic connecting mast 822 extends from the bottom of the electronic connecting board 821 toward the base 10. The electronic connecting board 821 is regularly flat-shaped. The electronic connecting board 821 is formed on the main part 721 of the second insulating part 72. A horizontal area of the electronic connecting board 821 is smaller than a horizontal area of main part 721, thereby exposing edges of a top surface of the main part 721. A side surface of the electronic connecting board 821 is coupled with an exposed top surface 7211 of the main part 721 to form a second sidestep part 823. The electronic connecting masts 822 are spaced apart from each other. Each electronic connecting mast 822 is embedded in a corresponding through hole 723. A height of the electronic connecting mast 822 is equal to a depth of the through hole 723, thereby attaching a bottom surface of the electronic connecting mast 822 on the top surface of the second barrier part 62 to ensure electronic connecting. In this exemplary embodiment, the electronic connecting board 821 and the electronic connecting masts 822 are obtained by integrated molding.

The second insulating layer 90 is formed on the first insulating layer 70. The second insulating layer 90 is spaced apart from the N-typed semiconductor layer 20, the active layer 30 and the P-typed semiconductor layer 40. Specifically, the second insulating layer 90 includes a third insulating part 91, a fourth insulating part 92 and a mid-part 93. The third insulating part 91 is formed on the first insulating part 71. The fourth insulating part 92 is formed on the second insulating part 72. The mid-part 93 connects the third insulating part 91 and the fourth insulating part 92. The second insulating layer 90 is made of materials with good heat exchange property. The second insulating layer 90 can be made of SiO2, TiO2, Si3N4, Al2O3, AlN or carbon oxygen compound and so on. A thickness of the second insulating layer 90 is less than 20 μm.

The third insulating part 91 is regularly flat-shaped. A locating hole 911 is defined on the third insulating part 91. The locating hole 911 is opposite to the first electronic connecting part 81 to hold the first electronic connecting part 81. A thickness of the third insulating part 91 is larger than a thickness of the first electronic connecting part 81. In other words, a top surface of the third insulating part 91 is higher than a top surface of the first electronic connecting part 81.

The fourth insulating part 92 includes an insulating board 921 and a side wall 922. The insulating board 921 is formed on the second electronic connecting part 82. The side wall 922 extends from peripheral of the insulating board 921 down and vertically. A locating hole 923 is defined on the insulating board 921 to expose part of a top surface of the second electronic connecting part 82. The locating hole 923 is opposite to the center of the electronic connecting board 821. The side wall 922 is formed to fill the second sidestep part 823. A width of the locating hole 923 of the insulating board 921 is larger than a width of the locating hole 911 of the third insulating part 91.

The mid-part 93 is formed and attached on the connecting part 73. A shape of the mid-part 93 is the same with a shape of the connecting part 73. An obtuse angle is defined by the mid-part 93 and the third insulating part 91. In this exemplary embodiment, the third insulating part 91, the fourth insulating part 92 and the mid-part 93 are obtained by integrated molding.

The N-electrode A and the P-electrode B are held in the locating hole 911 and the locating hole 923 respectively. Specifically, the N-electrode A is held in the locating hole 911 of the third insulating part 91. The P-electrode B is held in the locating hole 923 of the fourth insulating part 92. The N-electrode A is spaced apart from the N-typed semiconductor layer 20. The N-electrode A is electronically connected to N-typed semiconductor layer 20 through the first electronic connecting part 81 and the first barrier part 61.

When the LED die 100 works, forward voltage is applied on the P-electrode B and the N-electrode A, holes of the P-typed semiconductor layer 40 and electrons of the N-typed semiconductor layer 20 can be coupled in the active layer 30 under the action of electric field, thereby releasing energy in the form of optical fiber.

Compared to traditional LED dies, the first insulating layer 70 of the LED die 100 in the present disclosure is formed between the P-electrode B and the P-typed semiconductor layer 40 and covers the exposed top surface 21 of the N-typed semiconductor layer 20 except the area where the first barrier part 61 located. Current is transmitted and uniform distributed by the electronic connecting masts 822, thereby ensuring uniformity of light emission of the LED die 100. Because the barrier layer 60 includes at least two materials of Cr, Ni and Ti and the materials are stacked. The barrier layer 60 is made of materials with low costs, thereby reducing production costs of the LED die 100. Additionally, the first sidestep part 63 and the second sidestep part 823 are formed on the edges of the top surface 43 of the P-typed semiconductor layer 40 and the edges of the top surface of the first insulating layer 70 respectively. The first sidestep part 63 and the second sidestep part 823 are filled by the side wall 622 of the second barrier part 62 of the first insulating layer 70 and the side wall 922 of the fourth insulating part 92 of the second insulating layer 90, thereby extending and curving the bonding path between adjacent layers, and further enhance the air tightness of the LED die 100.

The LED die 100 can also not include the reflecting layer 50, thereby directly contacting the N-electrode A formed on the N-typed semiconductor layer 20 to the first barrier part 61.

The first insulating layer 70 can also not include the connecting part 73. Then the first insulating part 71 and the second insulating part 72 are spaced apart from each other. The mid-part 93 of the second insulating layer 90 locates between the first insulating part 71 and the second insulating part 72. The mid-part 93 contacts to the side surface 41 of the P-typed semiconductor layer 40 and the side surface 31 of the active layer 30 directly.

The exemplary embodiment shown and described above is only an example. Many details are often found in the art such as the other features of the LED die. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the exemplary embodiments described above may be modified within the scope of the claims.

What is claimed is:

1. A LED die, comprising:
   a base;
   an N-typed semiconductor layer, an active layer and a P-typed semiconductor layer formed on the base in that order;
   an N-electrode formed on and electronically connected to the N-typed semiconductor layer;
   a P-electrode formed on and electronically connected to the P-typed semiconductor layer;
   a first insulating layer, the first insulating layer comprising a first insulating part and a second insulating part, the first insulating part formed on the N-typed semiconductor layer, and the second insulating part formed on the P-typed semiconductor layer; and
   a barrier layer formed between the P-electrode and the P-typed semiconductor layer; the barrier layer comprising at least two layers, each layer made of one material selected from at least Cr, Ni and Ti, each of the at least two layers made of a different material, the at least two layers stacked on the P-typed semiconductor layer;
   wherein the barrier layer comprises a first barrier part and a second barrier part, the first barrier part and the second barrier part are spaced apart from each other, the first barrier part is directly formed on the N-typed semiconductor layer, and the second barrier part is formed on the P-typed semiconductor layer;
   wherein through holes are defined on the first insulating part and the second insulating part, a number of the through holes on the second insulating part is larger than a number of the through holes on the first insulating part;
   wherein the second barrier part comprises a main body, a horizontal area of the main body is smaller than an area of a top surface of the P-typed semiconductor layer, and the through holes of the second insulating part are located on the main body; and
   wherein the second barrier part further comprises a side wall, the side wall extends down and vertically from a periphery of the main body.

2. The LED die of claim 1, wherein a first sidestep part is defined by the side wall of the second barrier part and an edge of the top surface of the P-typed semiconductor layer, the second insulating part comprises a limiting part, and the limiting part fills the first sidestep part.

* * * * *